United States Patent
Terashima

(10) Patent No.: US 10,658,193 B2
(45) Date of Patent: May 19, 2020

(54) ETCHING METHOD AND ETCHING APPARATUS

(71) Applicant: Tokyo Electron Limited, Tokyo (JP)

(72) Inventor: Ryo Terashima, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/245,411

(22) Filed: Jan. 11, 2019

(65) Prior Publication Data
US 2019/0214267 A1 Jul. 11, 2019

(30) Foreign Application Priority Data

Jan. 11, 2018 (JP) .................................. 2018-002342

(51) Int. Cl.
H01L 21/311 (2006.01)
H01L 27/11582 (2017.01)
H01L 27/1157 (2017.01)
H01L 21/28 (2006.01)
H01J 37/32 (2006.01)
H01L 27/11575 (2017.01)

(52) U.S. Cl.
CPC .. *H01L 21/31116* (2013.01); *H01J 37/32449* (2013.01); *H01L 21/31144* (2013.01); *H01L 27/1157* (2013.01); *H01L 27/11575* (2013.01); *H01L 27/11582* (2013.01); *H01L 29/40117* (2019.08); *H01J 2237/334* (2013.01)

(58) Field of Classification Search
None
See application file for complete search history.

(56) References Cited

U.S. PATENT DOCUMENTS

| 4,403,241 A * | 9/1983 | Butherus ........... H01L 21/30621 257/276 |
| 4,698,128 A * | 10/1987 | Berglund ............. H01L 21/3065 438/701 |
| 4,715,930 A * | 12/1987 | Diem ................ H01L 29/66765 257/53 |
| 4,832,788 A * | 5/1989 | Nemiroff .......... H01L 21/31138 257/E21.256 |
| 4,952,274 A * | 8/1990 | Abraham .................. G03F 7/24 204/192.32 |

(Continued)

FOREIGN PATENT DOCUMENTS

WO 2013/121936 A1 8/2013

*Primary Examiner* — Allan W. Olsen
(74) *Attorney, Agent, or Firm* — Pearne & Gordon LLP

(57) ABSTRACT

Roughness of an end surface portion of a step shape can be decreased. An etching method includes a first etching process and a second etching process. In the first etching process, etching is performed on a processing target object, which has a silicon-containing film thereon and a photoresist formed on a surface of the silicon-containing film and which is placed in a processing vessel, to etch the silicon-containing film by using the photoresist as a mask. In the second etching process, a first processing gas containing oxygen and halogen is supplied into the processing vessel, or a third processing gas containing the oxygen is supplied into the processing vessel after a second processing gas containing the halogen is supplied into the processing vessel. The first etching process and the second etching process are repeated a multiple number of times.

14 Claims, 20 Drawing Sheets

(56) References Cited

U.S. PATENT DOCUMENTS

| | | | | |
|---|---|---|---|---|
| 6,284,666 | B1* | 9/2001 | Naeem | H01L 21/3065 257/E21.218 |
| 6,682,657 | B2* | 1/2004 | Dutton | G02B 3/0012 216/2 |
| 7,491,343 | B2* | 2/2009 | Adams | H01L 21/0212 216/37 |
| 8,298,959 | B2* | 10/2012 | Cheshire | B81C 1/00531 216/79 |
| 9,059,038 | B2* | 6/2015 | Li | H01L 22/12 |
| 9,330,926 | B2* | 5/2016 | Chebi | H01J 37/3244 |
| 2002/0093858 | A1* | 7/2002 | Ludwig | H01L 21/28273 365/200 |
| 2002/0179570 | A1* | 12/2002 | Mathad | H01L 21/3065 216/67 |
| 2005/0136682 | A1* | 6/2005 | Hudson | H01L 21/31116 438/714 |
| 2009/0184089 | A1* | 7/2009 | Chebi | H01J 37/3244 216/13 |
| 2010/0308014 | A1* | 12/2010 | Cheshire | B81C 1/00531 216/37 |
| 2011/0281379 | A1* | 11/2011 | Yang | H01L 21/02071 438/16 |
| 2014/0363980 | A1* | 12/2014 | Kawamata | H01L 21/0273 438/723 |
| 2015/0371889 | A1* | 12/2015 | Kim | H01L 21/6719 438/714 |

* cited by examiner

SI-BASED DEPOSIT ADHERES TO SIDE SURFACE OF PR

| HALOGEN GAS | TYPICAL REACTION PRODUCT | BOILING POINT (1 ATMOSPHERE) [°C] |
|---|---|---|
| F | SiF4<br>CF4 | −95.5<br>−111.3 |
| Cl | SiCl4<br>CCl4 | 57.7<br>76.8 |
| Br | SiBr4<br>CBr4 | 153<br>190 |

FIG. 8A

| COMPARATIVE EXAMPLE | Time [sec] | Press. [mTorr] | 100MHz [W] | 0.4MHz [W] | Ar [sccm] | O2 [sccm] | C4F8 [sccm] | CF4 [sccm] | He [sccm] | CH3F [sccm] | Cl2 [sccm] | Cycle A | Cycle B |
|---|---|---|---|---|---|---|---|---|---|---|---|---|---|
| Ox | 9.0 | 50 | 2400 | 200 | 600 | 20 | 35 | - | - | - | - | 3 | 5 |
| SiN | 12 | 50 | 1800 | 300 | - | 60 | - | - | 150 | 100 | - | | |
| PR | 15 | 8000 | 5000 | 0 | - | 1000 | - | - | - | - | - | 1 | |

FIG. 8B

| | COMPARATIVE EXAMPLE |
|---|---|
| AVERAGE TRIMMING RATE [nm/min] | 1898.4 |
| ROUGHNESS 3σ [nm] | 12.3 |
| $T_L/T_V$ | 0.65 |

FIG. 9A

| EXPERIMENTAL EXAMPLE 1 | Time [sec] | Press. [mTorr] | 100MHz [W] | 0.4MHz [W] | Ar [sccm] | O2 [sccm] | C4F8 [sccm] | CF4 [sccm] | He [sccm] | CH3F [sccm] | Cl2 [sccm] | Cycle A | Cycle B |
|---|---|---|---|---|---|---|---|---|---|---|---|---|---|
| Ox | 9.0 | 50 | 2400 | 200 | 600 | 20 | 35 | - | - | - | - | 3 | 5 |
| SiN | 12 | 50 | 1800 | 300 | - | 60 | - | 160 | 150 | 100 | - | | |
| PR | 10 | 8000 | 5000 | 0 | - | 1000 | - | - | - | - | 40 | 1 | |

FIG. 9B

|  | EXPERIMENTAL EXAMPLE 1 |
|---|---|
| AVERAGE TRIMMING RATE [nm/min] | 3519.6 |
| ROUGHNESS $3\sigma$ [nm] | 4.5 |
| $T_L/T_V$ | 0.72 |

FIG. 10A

| CONDITIONS | Time [sec] | Press. [mTorr] | 100MHz [W] | 0.4MHz [W] | Ar [sccm] | O2 [sccm] | C4F8 [sccm] | CF4 [sccm] | He [sccm] | CH3F [sccm] | Cl2 [sccm] | Cycle A | Cycle B |
|---|---|---|---|---|---|---|---|---|---|---|---|---|---|
| Ox | 9.0 | 50 | 2400 | 200 | 600 | 20 | 35 | - | - | - | - | 3 | 5 |
| SiN | 12 | 50 | 1800 | 300 | - | 60 | - | - | 150 | 100 | - | | |
| PR | 15 | 8000 | 5000 | 0 | - | 1000 | - | - | - | - | xx | 1 | |

FIG. 10B

| | COMPARATIVE EXAMPLE O2=1000 [sccm] | EXPERIMENTAL EXAMPLE 2 O2/Cl2= 1000/5 [sccm] | EXPERIMENTAL EXAMPLE 3 O2/Cl2= 1000/10 [sccm] | EXPERIMENTAL EXAMPLE 4 O2/Cl2= 1000/20 [sccm] | EXPERIMENTAL EXAMPLE 5 O2/Cl2= 1000/40 [sccm] |
|---|---|---|---|---|---|
| AVERAGE TERRACE WIDTH [nm] | 474.6 | 633.5 | 599.0 | 461.6 | 409.3 |
| AVERAGE TAPER ANGLE | 73 DEGREES | 79 DEGREES | 77 DEGREES | 77 DEGREES | 77 DEGREES |
| ROUGHNESS 3σ | 12.3nm | 4.3nm | 5.8nm | 4.9nm | 5.8nm |
| $T_L/T_V$ | 0.65 | 0.73 | 0.72 | 0.66 | 0.64 |

FIG. 11A

| CONDITIONS | Time [sec] | Press. [mTorr] | 100MHz [W] | 0.4MHz [W] | Ar [sccm] | O2 [sccm] | C4F8 [sccm] | CF4 [sccm] | He [sccm] | CH3F [sccm] | Cl2 [sccm] | Cycle A | Cycle B |
|---|---|---|---|---|---|---|---|---|---|---|---|---|---|
| Ox | 9.0 | 50 | 2400 | 200 | 600 | 20 | 35 | – | – | – | – | 3 | 5 |
| SiN | 12 | 50 | 1800 | 300 | – | 60 | – | – | 150 | 100 | – | | |
| PR | 15 | 8000 | 5000 | 0 | – | 1000 | – | xx | – | – | – | 1 | |

FIG. 11B

| | COMPARATIVE EXAMPLE O2=1000 [sccm] | EXPERIMENTAL EXAMPLE 6 O2/CF4= 1000/20 [sccm] | EXPERIMENTAL EXAMPLE 7 O2/CF4= 1000/80 [sccm] | EXPERIMENTAL EXAMPLE 8 O2/CF4= 1000/160 [sccm] |
|---|---|---|---|---|
| AVERAGE TERRACE WIDTH [nm] | 474.6 | 488.6 | 876.9 | 1298.6 (CORRESPONDING TO 15 sec) |
| AVERAGE TAPER ANGLE | 73 DEGREES | 75 DEGREES | 73 DEGREES | 74 DEGREES |
| ROUGHNESS 3σ | 12.3nm | 10.9nm | 12.5nm | 8.1nm |
| $T_L/T_V$ | 0.65 | 0.65 | 0.79 | 0.82 |

FIG. 12A

| CONDITIONS | Time [sec] | Press. [mTorr] | 100MHz [W] | 0.4MHz [W] | Ar [sccm] | O2 [sccm] | C4F8 [sccm] | CF4 [sccm] | He [sccm] | CH3F [sccm] | Cl2 [sccm] | NF3 [sccm] | Cycle A | Cycle B |
|---|---|---|---|---|---|---|---|---|---|---|---|---|---|---|
| Ox | 9.0 | 50 | 2400 | 200 | 600 | 20 | 35 | - | - | - | - | - | 3 | 5 |
| SiN | 12 | 50 | 1800 | 300 | - | 60 | - | - | 150 | 100 | - | - | | |
| PR | 15 | 8000 | 5000 | 0 | - | 1000 | - | - | - | - | - | xx | 1 | |

FIG. 12B

|  | COMPARATIVE EXAMPLE O2=1000 [sccm] | EXPERIMENTAL EXAMPLE 9 O2/NF3= 1000/40 [sccm] | EXPERIMENTAL EXAMPLE 10 O2/NF3= 1000/80 [sccm] |
|---|---|---|---|
| AVERAGE TERRACE WIDTH [nm] | 474.6 | 682.2 | 1205.5 |
| AVERAGE TAPER ANGLE | 73 DEGREES | 73 DEGREES (REFERENCE VALUE) | 69 DEGREES (REFERENCE VALUE) |
| ROUGHNESS 3$\sigma$ | 16.1nm | 53.8nm | 61.2nm |
| $T_L/T_V$ | 0.65 | 0.69 | 0.83 |

FIG. 13A

| CONDITIONS | Time [sec] | Press. [mTorr] | 100MHz [W] | 0.4MHz [W] | Ar [sccm] | O2 [sccm] | C4F8 [sccm] | CF4 [sccm] | He [sccm] | CH3F [sccm] | Cl2 [sccm] | NF3 [sccm] | Cycle A | Cycle B |
|---|---|---|---|---|---|---|---|---|---|---|---|---|---|---|
| Ox | 9.0 | 50 | 2400 | 200 | 600 | 20 | 35 | - | - | - | - | - | 3 | 5 |
| SiN | 12 | 50 | 1800 | 300 | - | 60 | - | - | 150 | 100 | - | - | | |
| PR | ww | 8000 | 5000 | 0 | - | 1000 | - | xx | - | - | yy | zz | 1 | |

FIG. 13B

|  | COMPARATIVE EXAMPLE<br>O2=1000 [sccm] | EXPERIMENTAL EXAMPLE 11<br>O2/CF4/Cl2= 1000/160/40 [sccm]<br>ww=10sec | EXPERIMENTAL EXAMPLE 12<br>O2/NF3/Cl2= 1000/80/40 [sccm]<br>ww=10sec |
|---|---|---|---|
| AVERAGE TERRACE WIDTH [nm] | 474.6 | 826.1 (CORRESPONDING TO 15 sec) | 896.7 (CORRESPONDING TO 15 sec) |
| AVERAGE TAPER ANGLE | 73 DEGREES | 70 DEGREES | 72 DEGREES |
| ROUGHNESS 3σ | 16.1nm | 5.0nm | 6.3nm |
| $T_L/T_V$ | 0.65 | 0.71 | 0.73 |

ETCHING METHOD AND ETCHING APPARATUS

CROSS-REFERENCE TO RELATED APPLICATION

This application claims the benefit of Japanese Patent Application No. 2018-002342 filed on Jan. 11, 2018, the entire disclosures of which are incorporated herein by reference.

TECHNICAL FIELD

The various aspects and embodiments described herein pertain generally to an etching method and an etching apparatus.

BACKGROUND

In the manufacture of a three-dimensional stacked semiconductor memory such as a 3D NAND flash memory, a process of etching a multilayered film in a step shape by using plasma is performed. In the process of etching the multilayered film in the step shape, etching of the multilayered film having a mask formed on a surface thereof and trimming of the mask on the multilayered film are alternately performed. To form the step shape by using a stacked structure of the multilayered film, it is important in the trimming of the mask to increase an etching rate of a mask material in the horizontal direction with respect to an etching rate in the vertical direction.

Patent Document 1: International Publication No. WO 2013/121936

In the prior art etching of the step shape, however, roughness of an end surface portion of the step shape is increased.

SUMMARY

In an exemplary embodiment, an etching method includes a first etching process and a second etching process. In the first etching process, etching is performed on a processing target object, which has a silicon-containing film thereon and a photoresist formed on a surface of the silicon-containing film and which is placed in a processing vessel, to etch the silicon-containing film by using the photoresist as a mask. In the second etching process, a first processing gas containing oxygen and halogen is supplied into the processing vessel, or a third processing gas containing the oxygen is supplied into the processing vessel after a second processing gas containing the halogen is supplied into the processing vessel. The first etching process and the second etching process are repeated a multiple number of times.

According to the exemplary embodiment, it is possible to decrease roughness of an end surface portion of a step shape.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A is a diagram showing an example of processing conditions for a comparative example;

FIG. 8B is a diagram showing an example of an evaluation result of a step shape formed in a multilayered film of a wafer under the processing conditions of the comparative example;

FIG. 9A is a diagram showing an example of processing conditions for an experimental example 1;

FIG. 9B is a diagram illustrating an example of an evaluation result of a step shape formed in the multilayered film of the wafer under the processing conditions of the experimental example 1;

FIG. 10A is a diagram showing processing conditions for experimental examples 2 to 5;

FIG. 10B is a diagram showing an example of evaluation results of step shapes formed in the multilayered film of the wafer under the processing conditions of the experimental examples 2 to 5;

FIG. 11A is a diagram showing processing conditions for experimental examples 6 to 8;

FIG. 11B is a diagram showing an example of evaluations results of step shapes formed in the multilayered film of the wafer under the processing conditions of the experimental examples 6 to 8;

FIG. 12A is a diagram showing processing conditions for experimental examples 9 and 10;

FIG. 12B is a diagram showing an example of evaluation results of step shapes formed in the multilayered film of the wafer under the processing conditions of the experimental examples 9 and 10;

FIG. 13A is a diagram showing processing conditions for experimental examples 11 and 12;

FIG. 13B is a diagram showing an example of evaluation results of step shapes formed in the multilayered film of the wafer under the processing conditions of the experimental examples 11 and 12.

DETAILED DESCRIPTION

Figure 1:
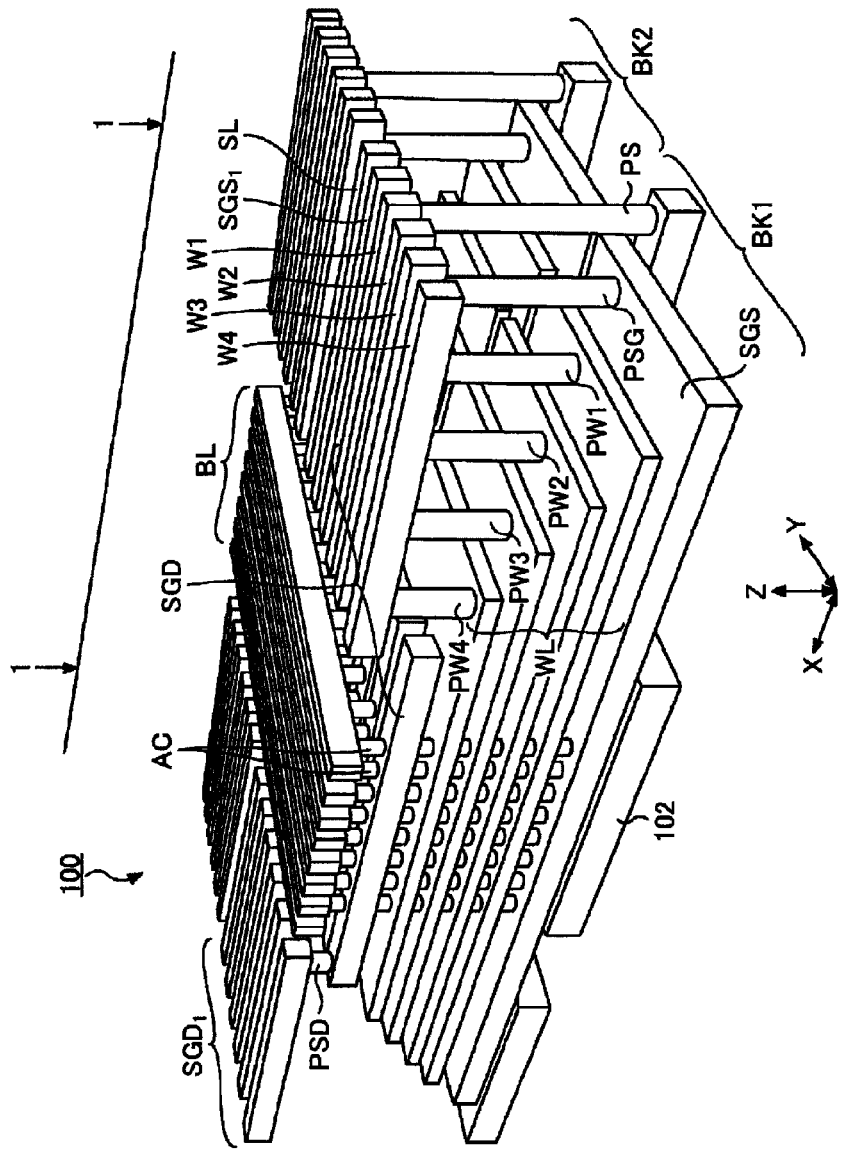
FIG. 1 is a perspective view conceptually illustrating a structure of a 3D NAND flash memory.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an etching method and an etching apparatus according to exemplary embodiments will be described in detail with reference to accompanying drawings. In the various drawings, same or corresponding parts will be assigned same reference numerals. However, the following exemplary embodiments are not meant to be anyway limiting, and the present disclosure is not limited thereto. The various exemplary embodiments may be appropriately combined as long as long as processing contents are not contradictory.

[Structure of Three-Dimensional Stacked Semiconductor Memory]

Figure 2:
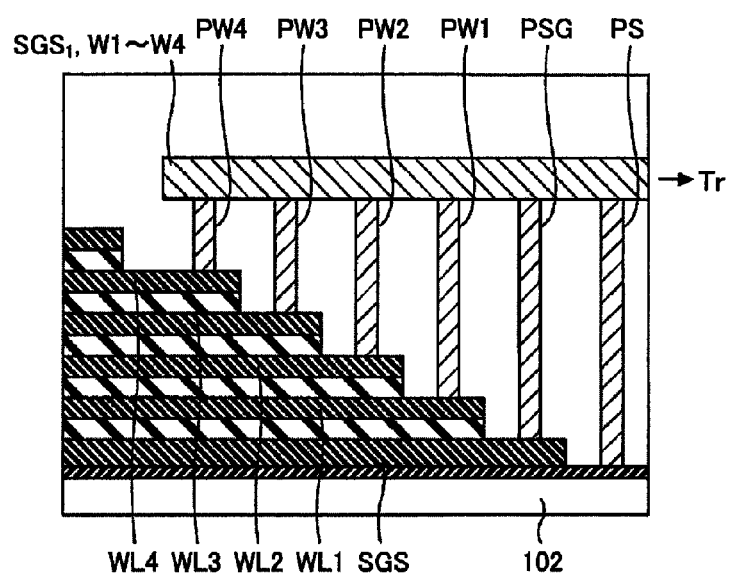
FIG. 2 is a cross sectional view of the 3D NAND flash memory taken along a line 1-1 of FIG. 1.

First, an example of a three-dimensional stacked semiconductor memory manufactured by using an etching method according to an exemplary embodiment will be explained with reference to FIG. 1 and FIG. 2. FIG. 1 is a perspective view conceptually illustrating a structure of a 3D NAND flash memory. FIG. 2 is a cross sectional view of the 3D NAND flash memory taken along a line 1-1 of FIG. 1. The 3D NAND flash memory is used as an example of the three-dimensional stacked semiconductor memory.

A NAND flash memory 100 shown in FIG. 1 includes, for example, a multiple number of blocks each of which serves as a single unit of erasing. Two blocks BK1 and BK2 are illustrated in FIG. 1. A source diffusion layer 102 is formed within a semiconductor substrate and is commonly shared by all of the blocks, for example. The source diffusion layer 102 is connected to a source line SL via a contact plug PS. A multilayered film in which, for example, first films and second films are alternately stacked on top of each other is formed on the source diffusion layer 102. The first film and the second film have different dielectric constants. In FIG. 1, though the multilayered film is illustrated to have a 6-layer structure for the convenience of illustration, it may have 16 or 36 layers or more.

In FIG. 1, each of five insulating films of the multilayered film except a topmost one is formed to have a plate shape within each of the blocks BK1 and BK2, and an end portion of each insulating film in the X direction is formed to have a step shape to provide a contact to the insulating film. Accordingly, the multilayered film has a substantially pyramid shape. A bottommost layer serves as a source-line side select gate line SGS, and the other four insulating films except the topmost and bottommost ones serve as four word lines WL. Further, though each insulating film of the multilayered film is shown in FIG. 1 to have a single step shape, each insulating film may be formed to have two or more steps.

The topmost layer is composed of a plurality of line-shaped conductive lines extended in the X direction. For example, six conductive lines are disposed within the single block BK1. The six conductive lines of the topmost layer serve as six bit-line side select gate lines SGD.

A multiple number of active layers AC for forming a NAND cell unit are formed to have a column shape in the Z direction (a vertical direction with respect to a surface of a semiconductor substrate) to reach the source diffusion layer 102 while passing through the respective insulating films.

Upper ends of the multiple number of active layers AC are respectively connected to a multiple number of bit lines BL extended in the Y direction. Further, the source-line side select gate line SGS is connected via a contact plug PSG to a leader line $SGS_1$ which is extended in the X direction. The word lines WL are respectively connected via contact plugs PW1 to PW4 to leader lines W1 to W4 which are extended in the X direction.

Further, the bit-line side select gate lines SGD are respectively connected via contact plugs PSD to leader lines $SGD_1$ which are extended in the X direction. The multiple number of bit lines BL, the leader line $SGS_1$ and the leader lines W1 to W4 are made of, by way of non-limiting example, a metal.

FIG. 2 is a cross sectional view taken along a line 1-1 of FIG. 1. The source-line side select gate line SGS and the word lines WL1 to WL4 are connected via the contact plug PSG and the contact plugs PW1 to PW4 to a transistor Tr constituting a non-illustrated driver through the leader line $SGS_1$ and the leader lines W1 to W4 extended in the X direction, respectively.

[Overall Configuration of Etching Apparatus]

Figure 3:
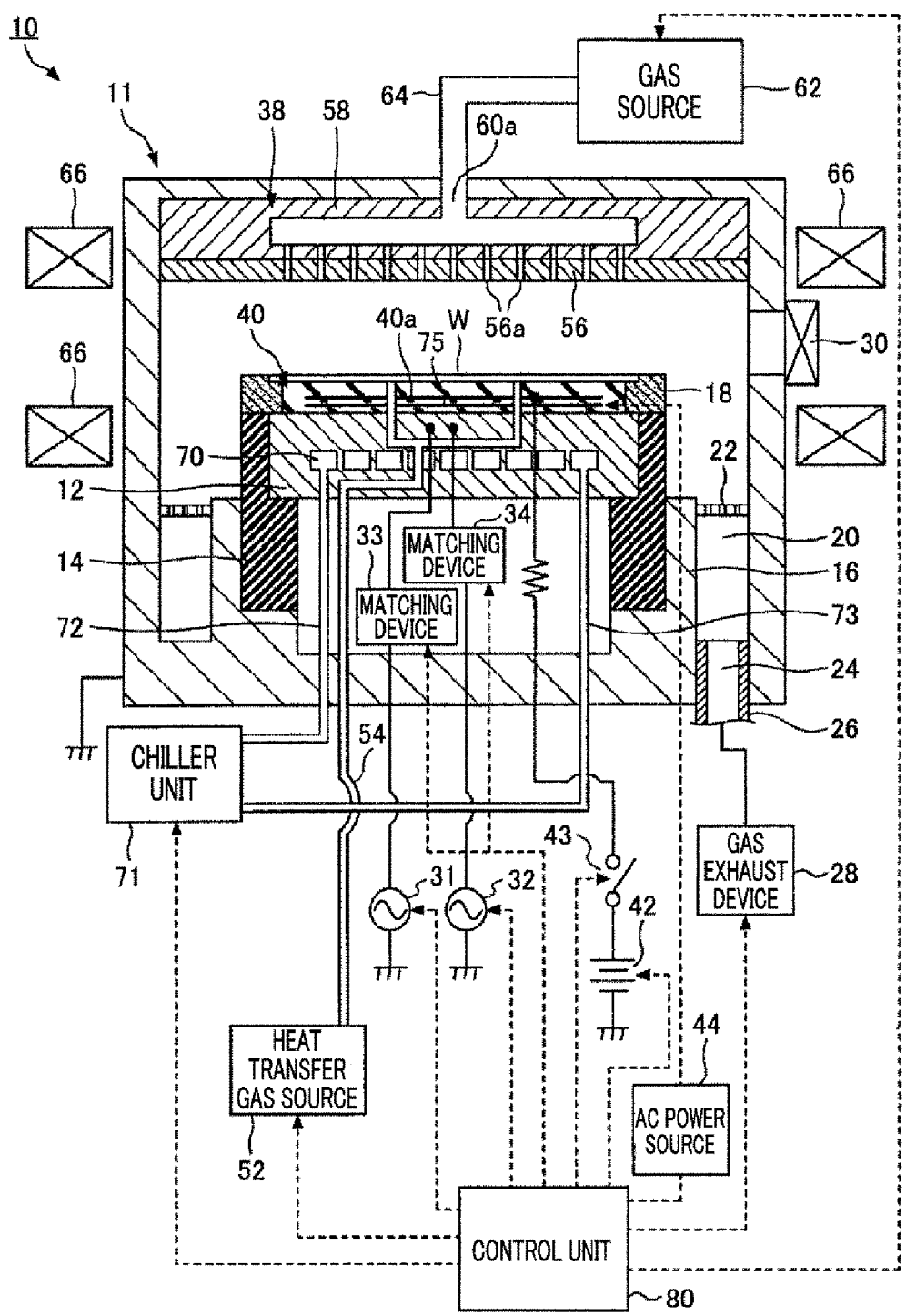
FIG. 3 is a cross sectional view illustrating an example of a configuration of an etching apparatus according to an exemplary embodiment.

Now, an overall configuration of an etching apparatus according to an exemplary embodiment will be explained with reference to FIG. 3, which provides a cross sectional view illustrating an example configuration of the etching apparatus. An etching apparatus 10 is configured as a parallel plate type (capacitively coupled) plasma etching apparatus configured to apply dual frequency powers to a lower electrode and has a cylindrical vacuum chamber (processing vessel) 11 made of, by way of non-limiting example, aluminum having an alumite-treated (anodically oxidized) surface. The chamber 11 is grounded.

A placing table 12 configured to place thereon a semiconductor wafer W (hereinafter, referred to as "wafer W") as a processing target object is provided within the chamber 11. The placing table 12 is made of, by way of non-limiting example, aluminum, and is supported by a cylindrical supporting member 16 extended vertically upwards from a bottom portion of the chamber 11 with an insulating cylindrical holding member 14 therebetween. To improve etching uniformity within a surface of the wafer W, a focus ring 18 made of, for example, silicon is disposed on a top surface of the placing table 12 to surround an edge of an electrostatic chuck 40.

A gas exhaust path 20 is provided between a sidewall of the chamber 11 and the cylindrical supporting member 16. An annular baffle plate 22 is provided in the gas exhaust path 20. A gas exhaust port 24 is provided at the bottom portion of the gas exhaust path 20 and is connected to a gas exhaust device 28 via a gas exhaust line 26. The gas exhaust device 28 has a non-illustrated vacuum pump and is configured to decompress a processing space within the chamber 11 to a required vacuum level. A gate valve 30 for a transfer of the wafer W is provided at the sidewall of the chamber 11, and the gate valve 30 is configured to open or close a carry-in/out opening for the wafer W.

A first high frequency power supply 31 for attraction of ions in plasma (for bias) and a second high frequency power supply 32 for plasma generation are electrically connected to the placing table 12 via a matching device 33 and a matching device 34, respectively. The first high frequency power supply 31 applies to the placing table 12 a first high frequency power having a frequency (e.g., 0.4 MHz) contributing to the attraction of the ions in the plasma into the wafer W on the placing table 12. The second high frequency power supply 32 applies to the placing table 12 a second high frequency power having a frequency (e.g., 100 MHz) contributing to the generation of the plasma within the chamber 11. With this configuration, the placing table 12 also serves as a lower electrode. A shower head 38 to be described later as an upper electrode having a ground potential is provided at a ceiling portion of the chamber 11. With this configuration, the high frequency power from the second high frequency power supply 32 is capacitively applied to a space between the placing table 12 and the shower head 38.

The electrostatic chuck 40 configured to hold the wafer W by an electrostatic attracting force is provided on the top surface of the placing table 12. The electrostatic chuck 40 includes a pair of insulating films and an electrode 40a embedded therebetween. The electrode 40a is made of a conductive film. A DC voltage source 42 is electrically connected to the electrode 40a via a switch 43. The electrostatic chuck 40 attracts and holds the wafer W on the electrostatic chuck by a Coulomb force generated by a voltage applied from the DC voltage source 42.

A heat transfer gas source 52 is configured to supply a heat transfer gas such as a He gas into a gap between a top surface of the electrostatic chuck 40 and a rear surface of the wafer W through a gas supply line 54.

The shower head 38 at the ceiling portion includes: an electrode plate 56 provided with a multiple number of gas holes 56a; and an electrode supporting body 58 configured to support the electrode plate 56 in a detachable manner. A gas source 62 is configured to supply various kinds of gases for use in the etching. By way of example, the gas source 62 is configured to supply various kinds of gases such as Ar, $O_2$, $C_4F_8$, He, $CH_3F$, $CF_4$, $NF_3$, and $Cl_2$. The gas source 62 supplies the gases through a gas supply line 64, and the gases from the gas supply line 64 is supplied into the shower head 38 from a gas inlet port 60a. The shower head 38 supplies the gases from the gas source 62 into the chamber 11 through the multiple number of gas holes 56a.

A magnet 66 is annularly or concentrically extended around the chamber 11, and controls the plasma generated in a plasma generation space within the chamber 11 by a magnetic force.

A coolant line 70 is provided within the placing table 12. A coolant of a preset temperature is supplied from a chiller unit 71 into the coolant line 70 to be circulated therein via pipelines 72 and 73. Further, a heater 75 is provided at a rear surface of the electrostatic chuck 40. A required AC voltage is applied to the heater 75 from an AC power source 44. With this configuration, the wafer W can be regulated to a required temperature through cooling by the chiller unit 71 and heating by the heater 75. Temperature control of the chiller unit 71 and the heater 75 is performed based on instructions from a control unit 80. In the present exemplary embodiment, the temperature of the wafer W is adjusted to, e.g., 45° C.

The control unit 80 controls the individual components of the etching apparatus 10, for example, the gas exhaust device 28, the AC power source 44, the DC voltage source 42, the switch 43 for the electrostatic chuck, the first and second high frequency power supplies 31 and 32, the matching devices 33 and 34, the heat transfer gas source 52, the gas source 62 and the chiller unit 71. Further, the control unit 80 is connected to a non-illustrated host computer.

The control unit 80 has a CPU (Central Processing Unit), a ROM (Read Only Memory) and a RAM (Random Access Memory) (not illustrated), and the CPU allows various types of processings to be performed in the etching apparatus 10 according to various kinds of programs or recipes stored in a non-illustrated storage unit. For example, the control unit 80 allows an etching process of forming a step shape at a multilayered film to be performed in the etching apparatus 10. The storage unit may be configured as a RAM or a ROM by using, but not limited to, a semiconductor memory, a magnetic disk or an optical disk. The programs or recipes may be provided by being stored on a recording medium and read by the storage unit via a non-illustrated driver, or may be stored in the storage unit by being downloaded from a non-illustrated network. Further, to realize the functions of the individual components, a DSP (Digital Signal Processor) may be used instead of the CPU. The function of the control unit 80 may be realized by being operated through either or both of software and hardware.

Now, a flow of etching operations of the etching apparatus 10 according to the exemplary embodiment will be briefly described. To perform the etching, the gate valve 30 is opened. A wafer W held on a transfer arm is carried into the chamber 11 through the gate valve 30. The carried wafer W is held by non-illustrated pusher pins which are raised from the placing table 12, and by lowering the pusher pins, the wafer W is placed on the electrostatic chuck 40. After the wafer W is carried in, the gate valve 30 is closed. The gas source 62 introduces processing gases for the etching into the chamber 11 at required flow rates and a required flow rate ratio. The gas exhaust device 28 decompresses the chamber 11 to a set value. Further, the first frequency power supply 31 and the second high frequency power supply 32 supply the high frequency powers of required power levels to the placing table 12. Further, the DC voltage source 42 applies the voltage to the electrode 40a of the electrostatic chuck 40, thus allowing the wafer W to be held on the electrostatic chuck 40. Further, the heat transfer gas source 52 supplies a He gas as the heat transfer gas into the gap between the top surface of the electrostatic chuck 40 and the rear surface of the wafer W. The processing gases supplied from the shower head 38 in a shower shape are excited into plasma by the high frequency power from the second high frequency power supply 32. As a result, the plasma is generated in the plasma generation space between the upper electrode (shower head 38) and the lower electrode (placing table 12). Ions in the plasma are attracted toward the wafer W by the high frequency power from the first high frequency power supply 31. As a result, a main surface of the wafer W is etched by the plasma.

Upon the completion of the plasma etching, the gate valve 30 is opened. The wafer W is raised by and held on the pusher pins. The transfer arm is carried into the chamber 11 through the gate valve 30. Then, the pusher pins are lowered, and the wafer W is held on the transfer arm. The transfer arm takes the wafer W out of the chamber 11 and carries a next wafer W into the chamber 11. By repeating these operations, wafers W are processed sequentially.

[Etching Process for Forming a Step Shape]

Figure 4A:
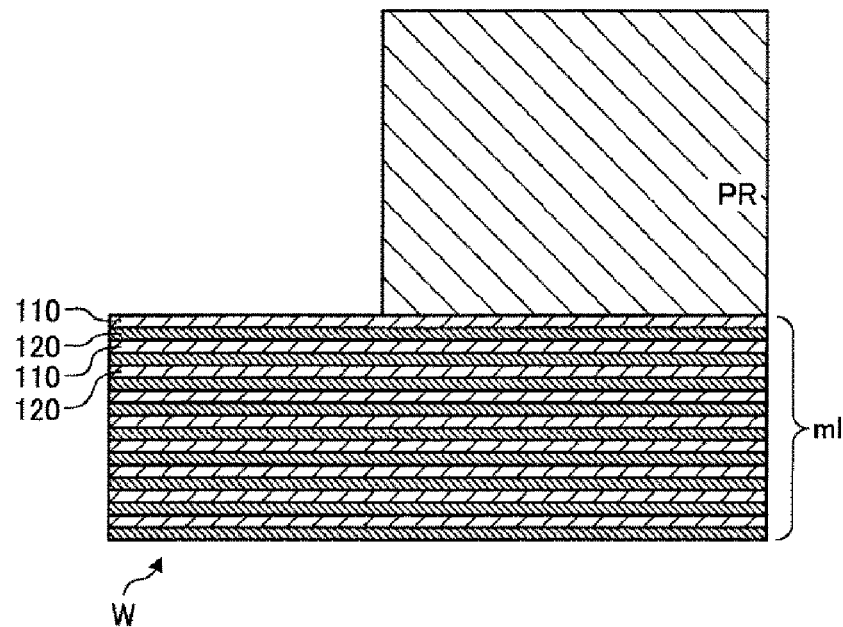
FIG. 4A is a diagram schematically illustrating an example of a structure of a wafer.

Now, an etching process for forming a step shape will be described. FIG. 4A is a diagram schematically illustrating an example of a wafer structure. A wafer W has a multilayered film ml in which first films 110 and second films 120 are alternately stacked. By way of example, the multilayered film ml is composed of the first films 110 and the second films 120 alternately stacked on top of each other in several tens to several hundreds of layers.

The first film 110 and the second film 120 are insulating films having different dielectric constants. In the present exemplary embodiment, a silicon oxide film ($SiO_2$) is used as the first film 110 and a silicon nitride film (SiN) is used as the second film 120 to form the multilayered film ml with the films having the different dielectric constants.

Here, however, a combination of the first film 110 and the second film 120 is not merely limited to the aforementioned silicon oxide film/silicon nitride film. For example, a polysilicon film (doped with impurities) may be formed as the first film 110, and a polysilicon film (not doped with impurities) may be formed as the second film 120. Depending on whether or not to perform the doping, the dielectric constants of the first film 110 and the second film 120 can be made different. As an example of the impurities for the doping, boron may be doped, for example.

Further, as another combination of the first film 110 and the second film 120, a silicon oxide film ($SiO_2$) may be used as the first film 110 and a polysilicon film (doped with impurities) may be used as the second film 120. Further, as still another combination of the first film 110 and the second film 120, a silicon oxide film ($SiO_2$) may be used as the first film 110 and a polysilicon film (not doped with impurities) may be used as the second film 120.

A photoresist layer PR serving as a mask is provided directly on top of the multilayered film ml. Etching of this photoresist layer PR mainly in the horizontal direction contributes to the formation of the step shape. The photoresist layer PR may be, by way of example, but not limitation, an organic film or an amorphous carbon film (α-C).

The etching apparatus 10 forms a step shape in the multilayered film ml by performing on the wafer W an etching processing including a first etching process and a second etching process which are repeated a preset number of times.

In the first etching process, the first films 110 and the second films 120 are etched. The first films 110 and the second films 120 may be etched through different processes or through the same process.

Through the first etching process, the photoresist layer PR of the wafer W serves as the mask, and a surface portion of the multilayered film ml which is not covered with the photoresist layer PR is mainly etched.

In the second etching process after the first etching process, the photoresist layer PR is etched. In the second etching process, processing conditions are optimized to allow the photoresist layer PR to be etched as in the horizontal direction as possible by enhancing etching in the horizontal direction with respect to the vertical direction. Since a side surface of the photoresist layer PR is also etched in the etching of the second etching process, this etching process is also called trimming.

Through the second etching process, a surface of the photoresist layer PR in the vertical direction, which is opposite from the multilayered film ml, and a surface of the photoresist layer PR in the horizontal direction are etched on the wafer W.

Figure 4B:
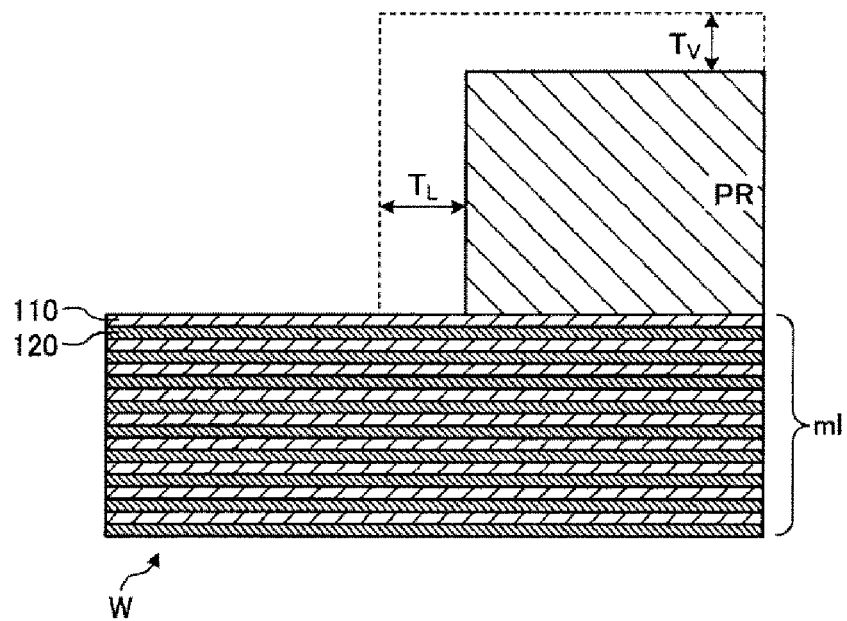
FIG. 4B is a diagram schematically showing an example of an etching result of a photoresist layer.

FIG. 4B is a diagram schematically illustrating an example of an etching result of the photoresist layer. As depicted in FIG. 4B, the photoresist layer PR is etched both in the vertical direction and in the horizontal direction. FIG. 4B shows an etching amount $T_V$ of the photoresist layer PR in the vertical direction and an etching amount $T_L$ of the photoresist layer PR in the horizontal direction in the second etching process performed a single time. In the second etching process, the larger a ratio of $T_L/T_V$ is, the better it is.

In the etching process of forming the step shape, by repeating the etching of the multilayered film ml through the first etching process and the trimming of the photoresist layer PR through the second etching process, the multilayered film ml is given to have the step structure.

Figure 4C:
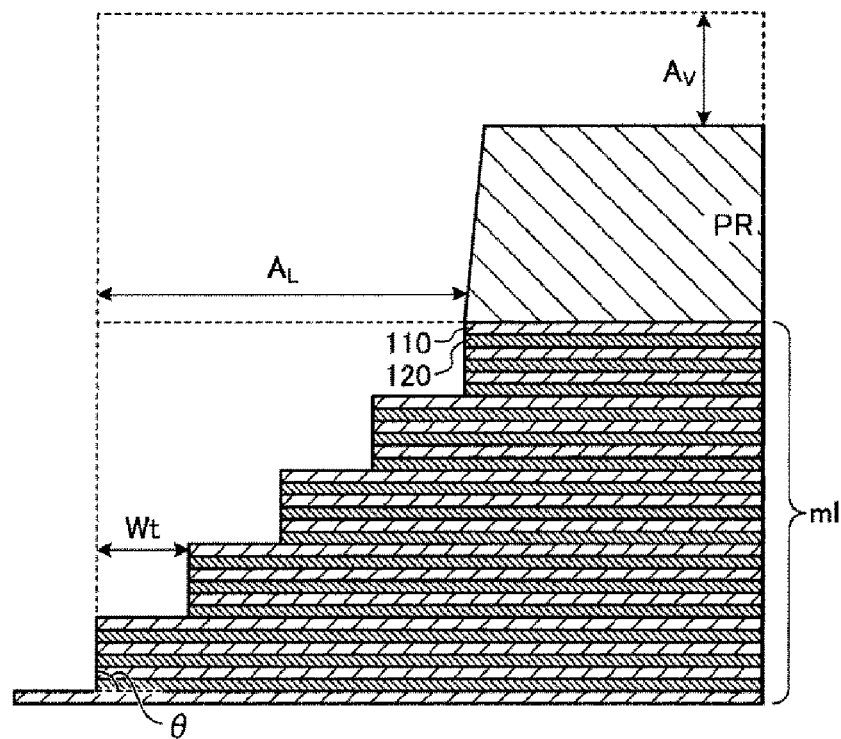
FIG. 4C is a diagram schematically illustrating an example of a step structure formed in a multilayered film.

FIG. 4C is a diagram schematically illustrating an example of the step structure formed in the multilayered film. In the example of FIG. 4C, a step structure with five steps is formed as a result of performing the first etching process five times and the second etching process four times. Further, in the example of FIG. 4C, multiple layers of the first films 110 and the second film 120 are etched in the first etching process performed a single time. FIG. 4C shows a total etching amount $A_V$ of the photoresist layer PR in the vertical direction and a total etching amount $A_L$ of the photoresist layer PR in the horizontal direction in the etching process of forming the step structure. Further, FIG. 4C also shows a terrace width $W_t$ of a terrace portion which is a plane portion of the step structure and a taper angle θ indicating an angle of an end surface portion of the step structure.

In a conventional etching for forming the step shape, however, roughness of the end portion of the step shape may be increased. By way of example, through the first etching process of etching the multilayered film ml, a reaction product adheres to the side surface of the photoresist layer PR. This reaction product may be, by way of example, a silicon-containing reaction product generated when the multilayered film ml is etched.

Figure 4D:
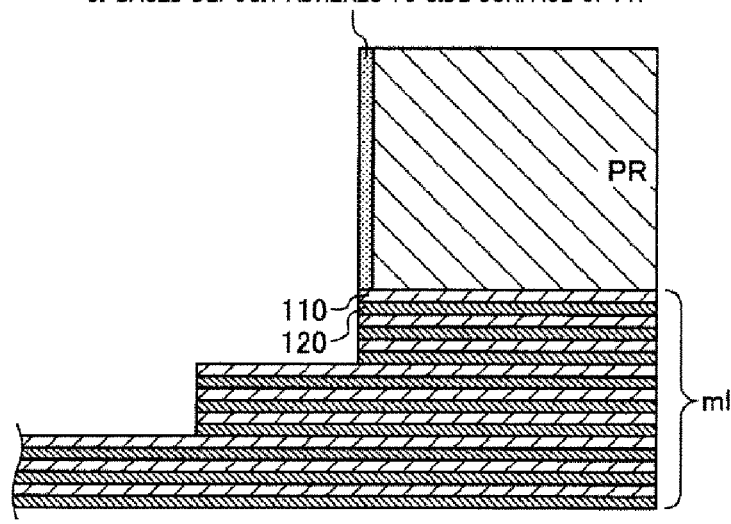
FIG. 4D is a diagram schematically illustrating an example of a state in which a reaction product is attached.

FIG. 4D is a diagram schematically illustrating a state in which the reaction product is attached. As shown in FIG. 4D, the silicon-containing reaction product (Si-based deposit) adheres to the side surface of the photoresist layer PR. In case that the silicon-containing reaction product adheres to the side surface of the photoresist layer PR in a non-uniform manner through the first etching process, an etching amount may be differed in the second etching process depending on an amount of the silicon-containing reaction product attached thereto. Therefore, irregularities may be formed at the side surface of the photoresist layer PR. These irregularities may be transferred to the multilayered film ml through the next first etching process. Further, as the first etching process and the second etching process are repeated, the roughness of the end surface portions of the step shape formed in the multilayered film ml of the wafer W is increased.

Figure 5A:
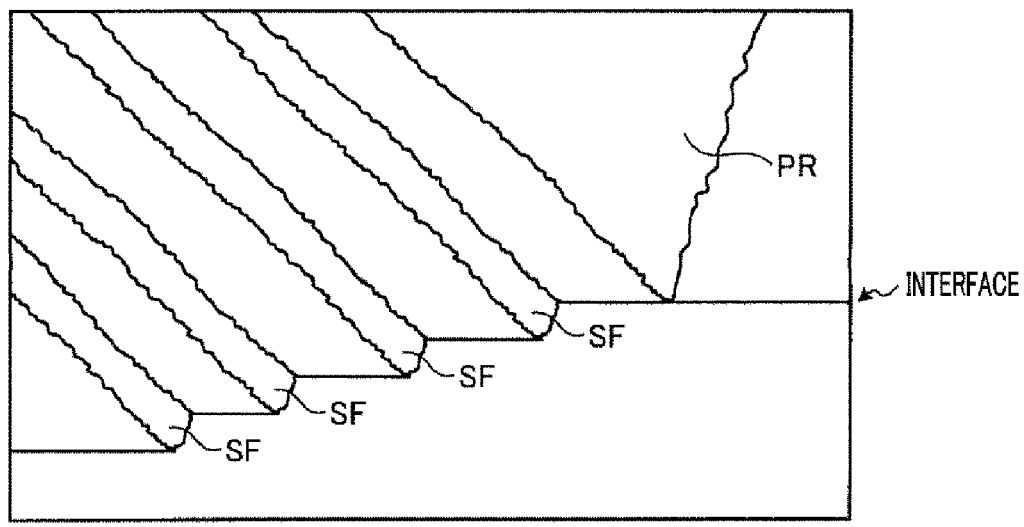
FIG. 5A is a perspective view illustrating an example of a step shape formed through the etching.
Figure 5B:
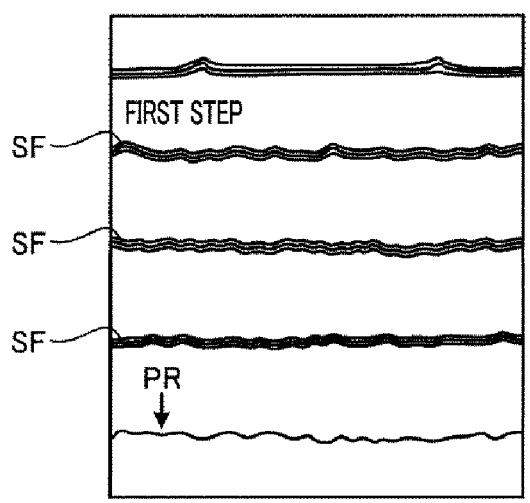
FIG. 5B is a top view illustrating the example of the step shape formed through the etching.

FIG. 5A is a perspective view illustrating an example of the step shape formed through the etching. FIG. 5B is a top view illustrating the example of the step shape formed through the etching. FIG. 5A and FIG. 5B show SEM (Scanning Electron Microscope) images. As shown in FIG. 5A and FIG. 5B, end surfaces SF of the step shape have irregularities.

In view of this, in the second etching process, the etching apparatus 10 according to the exemplary embodiment sets an internal pressure of the chamber 11 to a preset pressure higher than the internal pressure of the chamber 11 in the first etching process. Then, the etching apparatus 10 supplies a first processing gas containing oxygen and halogen into the chamber 11. For example, the etching apparatus 10 according to the present exemplary embodiment supplies the first processing gas containing $O_2$ and $Cl_2$ from the shower head 38.

Figures 6, 7:
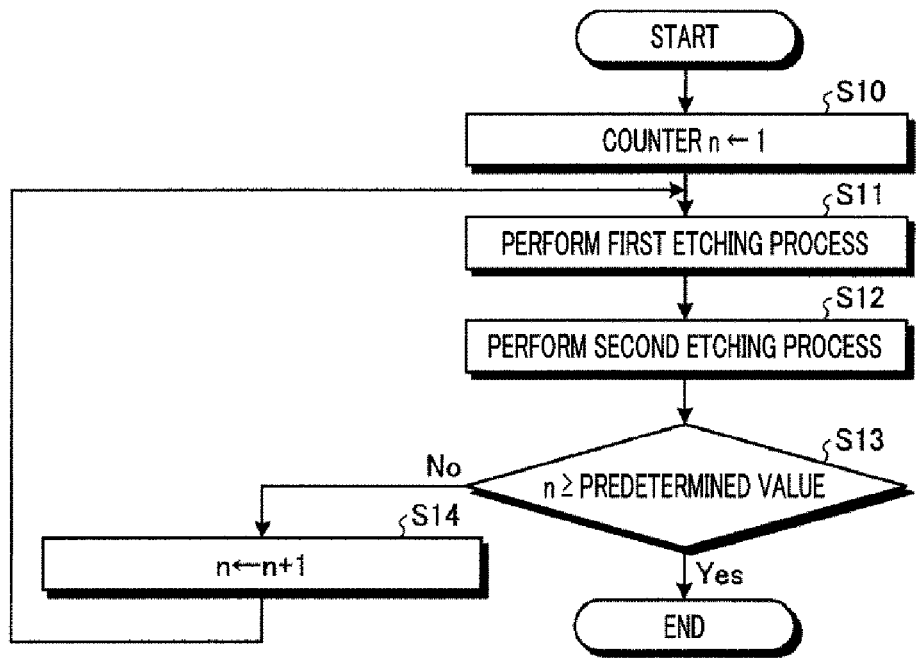
FIG. 6 is a diagram showing examples of elements of halogen group and boiling points of reaction products.
FIG. 7 is a flowchart illustrating an example flow of an etching method according to the exemplary embodiment.

FIG. 6 is a diagram illustrating examples of elements of halogen group and boiling points of reaction products at an atmospheric pressure (1 atmosphere). FIG. 6 shows F, Cl and Br as the elements of the halogen group. Further, FIG. 6 shows examples of the reaction products generated through reactions with F, Cl and Br. If a halogen gas of F, Cl or Br is included in the processing gas of the second etching process, the halogen gas reacts with the silicon-containing reaction product adhering to the side surface of the photoresist layer PR and the like, so that a Si-based reaction product is generated. Further, the halogen gas also reacts with the photoresist layer PR, so that a C-based reaction product is generated. As an example, Cl produces $SiCl_4$ as the Si-based reaction product. Further, Cl produces $CCl_4$ as the C-based reaction product. The $SiCl_4$ has a boiling point of 57.7° C. at 1 atmosphere, and the $CCl_4$ has a boiling point of 76.8° C. at 1 atmosphere. If the boiling point of the Si-based reaction product is lower than the boiling point of the C-based reaction product as in this example, the Si-based reaction product is easy to selectively remove. If an element of the halogen group having a larger atomic number than Cl is supplied, the boiling point of the Si-based reaction product is always smaller than the boiling point of the C-based reaction product.

In the etching apparatus 10 according to the present exemplary embodiment, one of the elements of the halogen group, which reacts with the silicon-containing reaction product to turn the corresponding reaction product into a first material having a vapor pressure higher than a pressure state of the second etching process and, also, which generates a second material having a vapor pressure lower than the pressure state of the second etching process by reacting with the photoresist layer PR, is included in the processing gas of the second etching process. By way of example, in the etching apparatus 10, a $Cl_2$ gas is included in the processing gas of the second etching process.

In the etching apparatus 10 according to the exemplary embodiment, the wafer W is regulated to have a temperature higher than the boiling point of the Si-based reaction product and lower than the boiling point of the C-based reaction product at the internal pressure of the processing vessel set in the second etching process. By way of example, the etching apparatus 10 sets the internal pressure of the processing vessel to 8000 mTorr (8 Torr) and the temperature of the wafer W to 45° C. Here, the examples of FIG. 6 show the boiling points at the atmospheric pressure (1 atmosphere). Since the second etching process is performed in the decompressed state (8 Torr), the temperature of the wafer W is set to be low. Accordingly, in the $SiCl_4$ and the $CCl_4$, the $SiCl_4$ vaporizes, so that the silicon-containing reaction product adhering to the side surface of the photoresist layer PR and the like is removed. Further, the halogen included in the processing gas of the second etching process may be selected based on the temperature of the wafer W.

As a result, the reaction product adhering to the side surface of the photoresist layer PR is removed, so that the irregularities due to the reaction product may not be formed. Therefore, the etching apparatus 10 according to the exemplary embodiment is capable of reducing the roughness of the end surface portions of the step shape formed in the multilayered film ml of the wafer W.

Further, the etching apparatus 10 according to the present exemplary embodiment supplies, in the second etching process, the first processing gas containing at least one of fluorocarbon or hydrofluorocarbon in addition to the oxygen and the halogen from the shower head 38. By way of non-limiting example, the etching apparatus 10 according to the present exemplary embodiment supplies from the shower head 38 the first processing gas containing at least one of $CF_4$ or $NF_3$ as well as the oxygen and the halogen. Accordingly, in the etching apparatus 10, a decrease of an etching rate can be suppressed.

Furthermore, though the etching apparatus 10 according to the present exemplary embodiment is described to supply the first processing gas containing the oxygen and the halogen into the chamber 11 in the second etching process, the oxygen and the halogen may be supplied separately. For example, the etching apparatus 10 may supply a third processing gas containing oxygen after supplying a second processing gas containing halogen into the chamber 11. In this case, the silicon-containing reaction product attached to the side surface of the photoresist layer PR and the like is removed by the second processing gas containing the halogen, and the photoresist layer PR is etched by the third processing gas containing the oxygen. Thus, in this case as well, the etching apparatus 10 is capable of reducing the roughness of the end surface portions of the step shape formed in the multilayered film ml of the wafer W.

In the meanwhile, exposed surfaces of the multilayered film ml exposed through the etching of the first etching process may be damaged. For example, the silicon oxide film ($SiO_2$) and the silicon nitride film (SiN) at the exposed side surface of the multilayered film ml and a horizontal surface of the silicon oxide film ($SiO_2$) may be damaged due to the etching process.

As a resolution, the etching apparatus 10 according to the present exemplary embodiment may supply, in the second etching process, a fourth processing gas containing oxygen prior to supplying the second processing gas containing the halogen. The exposed surfaces are oxidized by the fourth processing gas containing the oxygen. Therefore, the etching apparatus 10 is capable of suppressing the damage upon the exposed surfaces which are exposed through the etching of the first etching process.

[Flow of Etching]

Now, a flow of the etching method performed by the etching apparatus 10 according to the present exemplary embodiment will be explained. FIG. 7 is a flowchart showing an example of the flow of the etching method according to the exemplary embodiment. Specifically, FIG. 7 shows a flow of the etching process of forming the step shape.

The control unit 80 initializes a counter n to 1 (process S10). The control unit 80 controls the etching apparatus 10 to perform, on the wafer W placed within the chamber 11, the first etching process of etching the multilayered film ml by using the photoresist layer PR as the mask (process S11). The control unit 80 controls the etching apparatus 10 to perform the second etching process of supplying the first processing gas containing the oxygen and the halogen into the chamber 11 while setting the internal pressure of the chamber 11 to the preset pressure higher than the internal pressure of the chamber 11 in the first etching process (process S12).

The control unit 80 determines whether a value of the counter n has reached a predetermined value corresponding to the number of steps of the step shape (process S13). If the value of the counter n is less than the predetermined value (S13: No), the control unit 80 adds 1 to the counter n (process S14) and returns to the aforementioned process S11.

Meanwhile, if the value of the counter n has reached the predetermined value (S13: Yes), the processing is ended.

Now, effects of the present disclosure will be discussed by using examples. First, a comparative example will be explained. FIG. 8A is a diagram showing an example of processing conditions for the comparative example. A wafer W has the same structure as shown in FIG. 4A. The first film 110 is a silicon oxide film. The second film 120 is a silicon nitride film. In FIG. 8A, processing conditions for the first etching process and the second etching process are shown. In the first etching process, processing conditions are differed between etching of the silicon oxide film ($O_x$) and etching of the silicon nitride film (SiN), and the etching of the silicon oxide film and the etching of the silicon nitride film are performed while changing the processing conditions alternately. A cycle A refers to the number of etching of the silicon oxide film and the silicon nitride film at a single step of a step shape. In the example of FIG. 8A, the etching of the silicon oxide film ($O_x$) and the etching of the silicon nitride film (SiN) are alternately repeated three times as the first etching process, and, then, etching of the photoresist layer PR is performed as the second etching process. A cycle B refers to a repetition number of the cycle A. In the example of FIG. 8A, the cycle A is performed five times. As a result, the step shape having steps corresponding to the number of the cycle B is formed in the multilayered film ml of the wafer W.

For example, in the comparative example, the etching of the silicon oxide film ($O_x$) in the first etching process is performed under the following processing conditions:
Etching time: 9.0 sec
Pressure: 50 mTorr
Power of the second high frequency power supply 32 (100 MHz): 2400 W
Power of the first high frequency power supply 31 (0.4 MHz): 200 W
Kinds and flow rates of gases: $Ar/O_2/C_4F_8$=600 sccm/20 sccm/35 sccm Further, in the comparative example, the etching of the silicon nitride film (SiN) in the first etching process is performed under the following processing conditions.
Etching time: 12.0 sec
Pressure: 50 mTorr
Power of the second high frequency power supply 32 (100 MHz): 1800 W
Power of the first high frequency power supply 31 (0.4 MHz): 300 W
Kinds and flow rates of gases: $O_2/He/CH_3F$=60 sccm/150 sccm/100 sccm Further, in the comparative example, the second etching process is performed under the following processing conditions. In the comparative example, the processing gas of the second etching process only contains oxygen without containing halogen, fluorocarbon, and hydrofluorocarbon.
Etching time: 15.0 sec
Pressure: 8000 mTorr
Power of the second high frequency power supply 32 (100 MHz): 5000 W
Power of the first high frequency power supply 31 (0.4 MHz): 0 W
Kinds and flow rates of gas: $O_2$=1000 sccm The etching apparatus 10 performs the etching process of forming the step shape in the multilayered film ml of the wafer W according to the processing conditions of the comparative example.

FIG. 8B is a diagram showing an example of an evaluation result of the step shape formed in the multilayered film of the wafer under the processing conditions of the comparative example. In the example of FIG. 8B, an average trimming rate of the photoresist layer PR, a roughness 3σ of the end surface portion of the step shape, and a ratio of $T_L/T_V$ are specified. The roughness 3σ of the end surface portion of the step shape is calculated for the end surface portion of a fourth step.

Evaluations for the etching under the processing conditions of the comparative example are as follows.
Average trimming rate of the photoresist layer PR: 1898.4 nm/min
Roughness 3σ of the end surface portion of the step shape: 12.3 nm
$T_L/T_V$: 0.65

Now, an experimental example 1 will be explained. FIG. 9A is a diagram showing an example of processing conditions for the experimental example 1. Processing conditions for the first etching process of the experimental example 1 are the same as those of the comparative example. Meanwhile, in the second etching process of the experimental example 1, the etching time is shortened from that of the comparative example, and the processing gas contains $O_2$, $CF_4$ and $Cl_2$.

For example, the processing conditions for the second etching process of the experimental example 1 are changed from those of the comparative example as follows.
Etching time: 10.0 sec
Kinds and flow rates of gases: $O_2/CF_4/Cl_2$=1000 sccm/160 sccm/40 sccm The etching apparatus 10 performs the etching process of forming the step shape in the multilayered film ml of the wafer W under the processing conditions of the experimental example 1.

FIG. 9B is a diagram showing an example of an evaluation result of the step shape formed in the multilayered film of the wafer under the processing conditions of the experimental example 1. In the example of FIG. 9B, the average trimming rate of the photoresist layer PR, the roughness 3σ of the end surface portion of the step shape, and the ratio of $T_L/T_V$ are specified.

Evaluations for the etching under the processing conditions of the experimental example 1 are as follows.
Average trimming rate of the photoresist layer PR: 3519.6 nm/min
Roughness 3σ of the end surface portion of the step shape: 4.5 nm
$T_L/T_V$: 0.72

As can be seen from this result, in the experimental example 1, the value of the roughness 3σ is reduced, and the roughness of the end surface portion of the step shape is reduced, as compared to the comparative example. Further, in the experimental example 1, the average trimming rate and the ratio of $T_L/T_V$ are found to be improved, as compared to those of the comparative example.

Now, experimental examples 2 to 5 will be explained. FIG. 10A is a diagram showing processing conditions for the experimental examples 2 to 5. Processing conditions for the first etching process in the experimental examples 2 to 5 are the same as those of the comparative example. Meanwhile, in the second etching process of the experimental examples 2 to 5, the etching time is set to be longer than that of the experimental example 1, and the processing gas contains oxygen and $Cl_2$ and a content ratio of the $Cl_2$ is varied. In FIG. 10A, "xx" denotes a flow rate of the $Cl_2$ gas.

For example, the processing conditions for the second etching process in the experimental example 2 are changed from those of the comparative example as follows.
Kinds and flow rates of gases: $O_2/Cl_2$=1000 sccm/5 sccm The processing conditions for the second etching process in the experimental example 3 are changed from those of the comparative example as follows.

Kinds and flow rates of gases: $O_2/Cl_2$=1000 sccm/10 sccm

The processing conditions for the second etching process in the experimental example 4 are changed from those of the comparative example as follows.

Kinds and flow rates of gases: $O_2/Cl_2$=1000 sccm/20 sccm

The processing conditions for the second etching process in the experimental example 5 are changed from those of the comparative example as follows.

Kinds and flow rates of gases: $O_2/Cl_2$=1000 sccm/40 sccm

The etching apparatus 10 performs the etching process of forming the step shape in the multilayered film ml of the wafer W according to the processing conditions of each of the experimental example 2 to 5.

FIG. 10B is a diagram showing an example of evaluation results of the step shapes formed in the multilayered films of the wafers under the processing conditions of the experimental examples 2 to 5. In the example of FIG. 10B, the average terrace width, the average taper angle, the roughness 3σ of the end surface portion of the step shape, and the ratio of $T_L/T_V$ are specified. Further, FIG. 10B also shows the evaluation result of the comparative example ($O_2$=1000 sccm).

Evaluations for the etching under the processing conditions of the comparative example are as follows.
Average terrace width: 474.6 nm
Average taper angle: 73 degrees
Roughness 3σ of the end surface portion of the step shape: 12.3 nm
$T_L/T_V$: 0.65

Evaluations for the etching under the processing conditions of the experimental example 2 are as follows.
Average terrace width: 633.5 nm
Average taper angle: 79 degrees
Roughness 3σ of the end surface portion of the step shape: 4.3 nm
$T_L/T_V$: 0.73

Evaluations for the etching under the processing conditions of the experimental example 3 are as follows.
Average terrace width: 599.0 nm
Average taper angle: 77 degrees
Roughness 3σ of the end surface portion of the step shape: 5.8 nm
$T_L/T_V$: 0.72

Evaluations for the etching under the processing conditions of the experimental example 4 are as follows.
Average terrace width: 461.6 nm
Average taper angle: 77 degrees
Roughness 3σ of the end surface portion of the step shape: 4.9 nm
$T_L/T_V$: 0.66

Evaluations for the etching under the processing conditions of the experimental example 5 are as follows.
Average terrace width: 409.3 nm
Average taper angle: 77 degrees
Roughness 3σ of the end surface portion of the step shape: 5.8 nm
$T_L/T_V$: 0.64

As can be seen from these results, in each of the experimental examples 2 to 5, the value of the roughness 3σ is reduced, and the roughness of the end surface portion of the step shape is reduced, as compared to those of the comparative example. As found from the results of the experimental examples 2 to 5, if the content ratio of the $Cl_2$ with respect to the $O_2$ is equal to or higher than 0.5% in the processing gas of the second etching process, the roughness of the end surface portion of the step shape can be reduced.

Meanwhile, in each of the experimental examples 2 to 5, the average terrace width is found to be equal to or slightly reduced from the average terrace width of the comparative example. Even if the second etching process is performed for the same time period, the terrace width is increased with a rise of the trimming rate of the side surface of the photoresist layer PR. In each of the experimental examples 2 to 5, the average terrace width is approximately equal to or slightly smaller than that of the comparative example. Thus, in each of the experimental examples 2 to 5, the average trimming rate is slightly lower than that of the experimental example 1.

Now, experimental examples 6 to 8 will be explained. FIG. 11A is a diagram showing processing conditions for the experimental examples 6 to 8. Processing conditions for the first etching process in the experimental examples 6 to 8 are the same as those of the comparative example. Meanwhile, in the second etching process of the experimental examples 6 to 8, the etching time is set to be longer than that of the experimental example 1, and the processing gas contains $O_2$ and $CF_4$ and the content ratio of the $CF_4$ is varied. In FIG. 11A, "xx" denotes a flow rate of the $CF_4$ gas.

For example, the processing conditions for the second etching process in the experimental example 6 are changed from those of the comparative example as follows.

Kinds and flow rates of gases: $O_2/CF_4$=1000 sccm/20 sccm

The processing conditions for the second etching process in the experimental example 7 are changed from those of the comparative example as follows.

Kinds and flow rates of gases: $O_2/CF_4$=1000 sccm/80 sccm

The processing conditions for the second etching process in the experimental example 8 are changed from those of the comparative example as follows.

Etching time: 10.0 sec
Kinds and flow rates of gases: $O_2/CF_4$=1000 sccm/160 sccm The etching apparatus 10 performs the etching process of forming the step shape in the multilayered film ml of the wafer W under each of the processing conditions of the experimental example 6 to 8.

FIG. 11B is a diagram showing an example of evaluation results of the step shapes formed in the multilayered films of the wafers under the processing conditions of the experimental examples 6 to 8. In the example of FIG. 11B, the average terrace width, the average taper angle, the roughness 3σ of the end surface portion of the step shape, and the ratio of $T_L/T_V$ are specified. Further, the same as in FIG. 10B, FIG. 11B also shows the evaluation result of the comparative example ($O_2$=1000 sccm).

Evaluations for the etching under the processing conditions of the experimental example 6 are as follows.
Average terrace width: 488.6 nm
Average taper angle: 75 degrees
Roughness 3σ of the end surface portion of the step shape: 10.9 nm
$T_L/T_V$: 0.65

Evaluations for the etching under the processing conditions of the experimental example 7 are as follows.
Average terrace width: 876.9 nm
Average taper angle: 73 degrees
Roughness 3σ of the end surface portion of the step shape: 12.5 nm
$T_L/T_V$: 0.79

Evaluations for the etching under the processing conditions of the experimental example 8 are as follows. Further, in the experimental example 8, since the etching time is set to be short (10.0 sec), the average terrace width is expressed as a value corresponding to 15.0 sec.

Average terrace width: 1298.6 nm
Average taper angle: 74 degrees
Roughness 3σ of the end surface portion of the step shape: 8.1 nm
$T_L/T_V$: 0.82

As can be seen from these results, in each of the experimental examples 6 to 8, the average terrace width is increased with a rise of the flow rate of the $CF_4$ gas, as compared to the comparative example. As found from this result, in the second etching process, if the flow rate of the $CF_4$ gas contained in the processing gas is increased, the average trimming rate is improved.

Meanwhile, in each of the experimental examples 6 to 8, the value of the roughness 3σ is found to be same or slightly reduced as compared to that of the comparative example, and the roughness of the end surface portion of the step shape is not improved sufficiently. That is, in the second etching process of the experimental examples 6 to 8, even if the oxygen and the $CF_4$ are contained in the processing gas, the roughness cannot be improved sufficiently.

Now, experimental examples 9 and 10 will be explained. FIG. 12A is a diagram showing processing conditions for the experimental examples 9 and 10. Processing conditions for the first etching process in the experimental examples 9 and 10 are the same as those of the comparative example. Meanwhile, in the second etching process of the experimental examples 9 and 10, the etching time is set to be longer than that of the experimental example 1, and the processing gas contains oxygen and $NF_3$ and the content ratio of the $NF_3$ is varied. In FIG. 12A, "xx" denotes a flow rate of the $NF_3$ gas.

For example, the processing conditions for the second etching process in the experimental example 9 are changed from those of the comparative example as follows.

Kinds and flow rates of gases: $O_2/NF_3$=1000 sccm/40 sccm

The processing conditions for the second etching process in the experimental example 10 are changed from those of the comparative example as follows.

Kinds and flow rates of gases: $O_2/NF_3$=1000 sccm/80 sccm

The etching apparatus 10 performs the etching process of forming the step shape in the multilayered film ml of the wafer W under each of the processing conditions of the experimental example 9 and 10.

FIG. 12B is a diagram showing an example of evaluation results of the step shapes formed in the multilayered films of the wafers under the processing conditions of the experimental examples 9 and 10. In the example of FIG. 12B, the average terrace width, the average taper angle, the roughness 3σ of the end surface portion of the step shape, and the ratio of $T_L/T_V$ are specified. Further, the same as in FIG. 10B, FIG. 12B also shows the evaluation result of the comparative example ($O_2$=1000 sccm).

Evaluations for the etching under the processing conditions of the experimental example 9 are as follows. Further, since the end surface portion of the step shape is rough and the variation of the taper angle is large, the average taper angle is provided as a reference value.

Average terrace width: 682.2 nm
Average taper angle: 73 degrees (reference value)
Roughness 3σ of the end surface portion of the step shape: 53.8 nm
$T_L/T_V$: 0.69

Evaluations for the etching under the processing conditions of the experimental example 10 are as follows. Further, since the end surface portion of the step shape is rough and the variation of the taper angle is large, an average taper angle is provided as a reference value.

Average terrace width: 1205.5 nm
Average taper angle: 69 degrees (reference value)
Roughness 3σ of the end surface portion of the step shape: 61.2 nm
$T_L/T_V$: 0.83

As can be seen from these results, in each of the experimental examples 9 and 10, the average terrace width is increased with a rise of the flow rate of the $NF_3$ gas, as compared to the comparative example. As found from this result, in the second etching process, if the flow rate of the $NF_3$ gas contained in the processing gas is increased, the average trimming rate is improved.

Meanwhile, in each of the experimental examples 9 and 10, the value of the roughness 3σ is greatly increased as compared to that of the comparative example, and the roughness of the end surface portion of the step shape is not improved. That is, in the second etching process of the experimental examples 9 and 10, even if the oxygen and the $NF_3$ are contained in the processing gas, the roughness cannot be improved.

Now, experimental examples 11 and 12 will be explained. FIG. 13A is a diagram showing processing conditions for the experimental examples 11 and 12. Processing conditions for the first etching process in the experimental examples 11 and 12 are the same as those of the comparative example. Meanwhile, in the second etching process of the experimental examples 11 and 12, the etching time is changed, and the processing gas contains $CF_4$ or $NF_3$ as well as oxygen and $Cl_2$, and content ratios of the $Cl_2$, the $CF_4$ and the $NF_3$ are varied. In FIG. 13A, "ww" denotes the etching time of the second etching process; "xx", a flow rate of the $CF_4$ gas; "yy", a flow rate of the $Cl_2$ gas; and "zz", a flow rate of the $NF_3$ gas.

For example, the processing conditions for the second etching process in the experimental example 11 are changed from those of the comparative example as follows.

Etching time: 10.0 sec
Kinds and flow rates of gases: $O_2/CF_4/Cl_2$=1000 sccm/160 sccm/40 sccm The processing conditions for the second etching process in the experimental example 12 are changed from those of the comparative example as follows.

Etching time: 10.0 sec
Kinds and flow rates of gases: $O_2/NF_3/Cl_2$=1000 sccm/80 sccm/40 sccm The etching apparatus 10 performs the etching process of forming the step shape in the multilayered film ml of the wafer W under each of the processing conditions of the experimental examples 11 and 12.

FIG. 13B is a diagram showing an example of evaluation results of the step shapes formed in the multilayered films of the wafers under the processing conditions of the experimental examples 11 and 12. In the example of FIG. 13B, the average terrace width, the average taper angle, the roughness 3σ of the end surface portion of the step shape, and the ratio of $T_L/T_V$ are specified. Further, the same as in FIG. 10B, FIG. 13B also shows the evaluation result of the comparative example ($O_2$=1000 sccm).

Evaluations for the etching under the processing conditions of the experimental example 11 are as follows. Further, in the experimental example 11, since the etching time is set to be short (10.0 sec), the average terrace width is expressed as a value calculated in terms of 15.0 sec.

Average terrace width: 826.1 nm
Average taper angle: 70 degrees
Roughness 3σ of the end surface portion of the step shape: 5.0 nm
$T_L/T_V$: 0.71

Evaluations for the etching under the processing conditions of the experimental example 12 are as follows. In this experimental example 12 as well, since the etching time is set to be short (10.0 sec), the average terrace width is expressed as a value calculated in terms of 15.0 sec.

Average terrace width: 896.7 nm
Average taper angle: 72 degrees
Roughness 3σ of the end surface portion of the step shape: 6.3 nm
$T_L/T_V$: 0.73

As can be seen from these results, in each of the experimental examples 11 and 12, the value of the roughness 3σ is decreased and the roughness of the end surface portion of the step shape is reduced, as compared to the comparative example.

Further, in each of the experimental examples 11 and 12, the average terrace width is increased as compared to that of the comparative example. As can be seen from this result, in the second etching process, by adding the $CF_4$ or the $NF_3$ to the processing gas which includes the $O_2$ and the $Cl_2$, the average trimming rate is improved.

Figure 14:
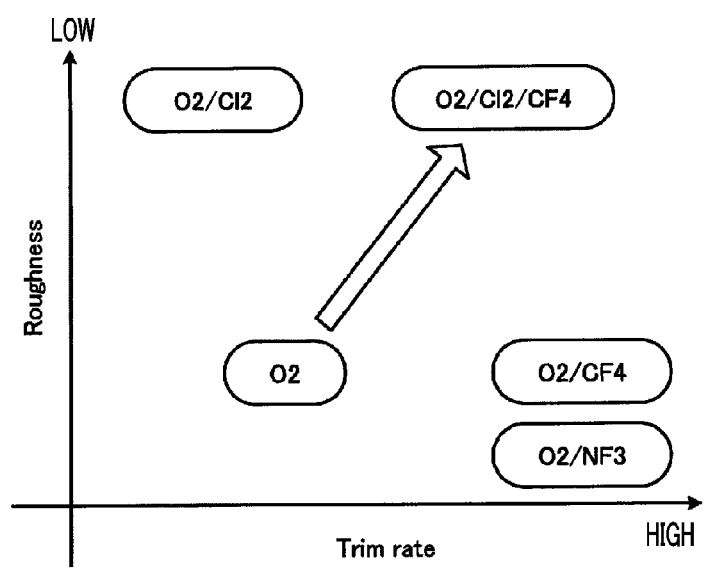
FIG. 14 is a diagram showing an example of dependency between a roughness and a trimming rate for a processing gas.

FIG. 14 is a diagram showing dependency between a roughness and a trimming rate for a processing gas. FIG. 14 shows the kinds of gases included in the processing gas of the second etching process. In the etching process of forming the step shape, by using the processing gas containing $O_2$, $CF_4$ and $Cl_2$ in the second etching process as in the experimental example 11, the roughness is reduced as compared to a case where the processing gas only contains $O_2$ as in the comparative example. Further, the trimming rate is improved. Moreover, in the etching process of forming the step shape, by using the processing gas containing $O_2$, $NF_3$ and $Cl_2$ in the second etching process as in the experimental example 12, the roughness is reduced, and the trimming rate is improved.

Meanwhile, in the etching process of forming the step shape, by using the processing gas containing $O_2$ and $Cl_2$ in the second etching process, as in the experimental examples 2 to 5, the roughness is reduced as compare to the case where the processing gas only contains $O_2$ as in the comparative example. However, the trimming rate is slightly reduced.

Furthermore, in the etching process of forming the step shape, by using the processing gas containing $CF_4$ or $NF_3$ as well as $O_2$ in the second etching process, as in the experimental examples 6 to 10, the trimming rate is improved as compared to the case where the processing gas only contains $O_2$ as in the comparative example. However, the roughness is reduced.

[Effects]

As stated above, the etching apparatus 10 according to the exemplary embodiment performs, on the wafer W placed within the chamber (processing vessel) 11 and having: the multilayered film ml in which the first films 110 and the second films 120 are alternately stacked on top of each other; and the photoresist layer PR formed on the surface of the multilayered film ml, the first etching process of etching the multilayered film ml by using the photoresist layer PR as the mask. The etching apparatus 10 performs the second etching process of supplying the first processing gas containing the oxygen and the halogen, or supplying the third processing gas containing the oxygen after supplying the second processing gas containing the halogen. The etching apparatus 10 repeats the first etching process and the second etching process multiple times. As a result, the etching apparatus 10 is capable of forming the step shape in the multilayered film ml. Further, the etching apparatus 10 is capable of reducing the roughness of the end surface portion of the step shape formed in the multilayered film ml.

Further, in the etching apparatus 10 according to the exemplary embodiment, in the second etching process, the internal pressure of the chamber 11 is set to the required pressure higher than that of the first etching process. Accordingly, the etching apparatus 10 is capable of increasing the etching rate of the photoresist layer PR in the horizontal direction.

In addition, in the etching apparatus 10 according to the exemplary embodiment, the halogen contained in the first processing gas is any one of the elements of the halogen group, which reacts with the silicon-containing reaction product generated by performing the first etching process to turn the corresponding reaction product into the first material (Si-based reaction product) having the vapor pressure higher than the pressure state of the second etching process and, also, which generates the second material (C-based reaction product) having the vapor pressure lower than the pressure state of the second etching process by reacting with the photoresist layer PR. Accordingly, the etching apparatus 10 is capable of removing the first material selectively between the second material and the first material.

Further, in the etching apparatus 10 according to the exemplary embodiment, the first processing gas further contains at least one of the fluorocarbon or the hydrofluorocarbon. For example, the etching apparatus 10 according to the exemplary embodiment further contains the $CF_4$ or the $NF_3$ in the first processing gas. Accordingly, the etching apparatus 10 is capable of improving the trimming rate of the photoresist layer PR.

Furthermore, in the etching apparatus 10 according to the exemplary embodiment, the content ratio of the halogen with respect to the oxygen in the first processing gas is set to be equal to or higher than 0.5%. Accordingly, the etching apparatus 10 is capable of reducing the roughness of the end surface portion of the step shape formed in the multilayered film ml.

Moreover, in the etching apparatus 10 according to the exemplary embodiment, the fourth processing gas containing the oxygen is supplied before supplying the second processing gas. Accordingly, the etching apparatus 10 is capable of suppressing the exposed surface, which is exposed through the etching of the first etching process, from being damaged.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

By way of example, though the exemplary embodiments have been described for the example where the step shape is formed in the multilayered film ml, a target on which the step shape is to be formed may not be particularly limited as long as it is a silicon-containing film, and can be a monolayer.

Further, though the exemplary embodiments have been described for the example where the processing target object is the wafer W having the multilayered film ml formed thereon, the processing target object is not limited thereto. The processing target object is not particularly limited as long as the step shape can be formed thereon.

I claim:

1. An etching method of etching a processing target object having a silicon-containing film thereon and a photoresist formed on a surface of the silicon-containing film, the etching method comprising:
 a first etching process of etching, by using the photoresist as a mask, the silicon-containing film of the processing target object placed in a processing vessel; and
 a second etching process of etching the photoresist by supplying a first processing gas containing oxygen and halogen into the processing vessel, or supplying a third processing gas containing the oxygen into the processing vessel after supplying a second processing gas containing the halogen into the processing vessel,
 wherein the first etching process and the second etching process are repeated a multiple number of times.

2. The etching method of claim 1,
 wherein an internal pressure of the processing vessel in the second etching process is set to a required pressure higher than the internal pressure of the processing vessel in the first etching process.

3. The etching method of claim 1,
 wherein the halogen contained in the first processing gas and the second processing gas is one of the elements of the halogen group, which reacts with a silicon-containing reaction product generated by performing the first etching process to turn the corresponding reaction product into a first material having a vapor pressure higher than the internal pressure of the processing vessel in the second etching process, and, also, which generates a second material having a vapor pressure lower than the internal pressure of the processing vessel in the second etching process by reacting with the photoresist layer PR.

4. The etching method of claim 1,
 wherein each of the first processing gas and the second processing gas further contains at least one of a fluorocarbon or a hydrofluorocarbon.

5. The etching method of claim 1,
 wherein a content ratio of the halogen with respect to the oxygen in the first processing gas is equal to or higher than 0.5%.

6. The etching method of claim 1,
 wherein, in the second etching process, a fourth processing gas containing the oxygen is supplied before supplying the second processing gas.

7. The etching method of claim 1,
 wherein the silicon-containing film is a multilayered film in which SiN layers and SiO layers are alternately stacked on top of each other.

8. The etching method of claim 1,
 wherein, in the second etching process, the photoresist is etched in a horizontal direction.

9. The etching method of claim 1,
 wherein, in the second etching process, a reaction product, which is generated by the first etching process and attached to the photoresist, is removed.

10. The etching method of claim 9,
 wherein the reaction product contains a silicon.

11. An etching apparatus, comprising:
 a processing vessel; and
 a control unit configured to perform a control, on a processing target object which has a silicon-containing film thereon and a photoresist formed on a surface of the silicon-containing film and which is placed in the processing vessel, such that a first etching process of etching the silicon-containing film by using the photoresist as a mask and a second etching process of, after the first etching process, etching the photoresist by supplying a first processing gas containing oxygen and halogen into the processing vessel, or supplying a third processing gas containing the oxygen into the processing vessel after supplying a second processing gas containing the halogen into the processing vessel are repeated a multiple number of times.

12. The etching apparatus of claim 11,
 wherein, in the second etching process, the photoresist is etched in a horizontal direction.

13. The etching apparatus of claim 11,
 wherein, in the second etching process, a reaction product, which is generated by the first etching process and attached to the photoresist, is removed.

14. The etching apparatus of claim 13,
 wherein the reaction product contains a silicon.

\* \* \* \* \*